United States Patent
Klamkin

(10) Patent No.: US 12,332,356 B2
(45) Date of Patent: Jun. 17, 2025

(54) LIDAR SENSOR FOR VEHICLE APPARATUS

(71) Applicant: Aeluma, Inc., Goleta, CA (US)

(72) Inventor: Jonathan Klamkin, Santa Barbara, CA (US)

(73) Assignee: Aeluma, Inc., Goleta, CA (US)

( * ) Notice: Subject to any disclaimer, the term of this patent is extended or adjusted under 35 U.S.C. 154(b) by 1030 days.

(21) Appl. No.: 17/356,261

(22) Filed: Jun. 23, 2021

(65) Prior Publication Data

US 2022/0413156 A1    Dec. 29, 2022

(51) Int. Cl.
| | |
|---|---|
| G01S 17/93 | (2020.01) |
| G01S 7/48 | (2006.01) |
| G01S 17/931 | (2020.01) |
| G01S 17/933 | (2020.01) |
| H01S 5/183 | (2006.01) |

(52) U.S. Cl.
CPC .......... *G01S 17/931* (2020.01); *G01S 7/4804* (2013.01); *G01S 17/933* (2013.01); *H01S 5/183* (2013.01)

(58) Field of Classification Search
None
See application file for complete search history.

(56) References Cited

U.S. PATENT DOCUMENTS

2003/0067011 A1\* 4/2003 Ando ............... B82Y 20/00
257/E31.063

FOREIGN PATENT DOCUMENTS

WO    2021024038 A1    2/2021

OTHER PUBLICATIONS

Extended European Search Report for related EP Application No. 22180355.4, mailed Nov. 18, 2022.
B. Song et al., "InGaAs Photodiode Array on Silicon by Heteroepitaxy", 2021 Conference on Lasers and Electro-Optics (CLEO), OSA, May 9, 2021, pp. 1-2, XP034003390, DOI: 10.1364/CLEO_SI.2021. STH@H.2.

(Continued)

*Primary Examiner* — Hovhannes Baghdasaryan
(74) *Attorney, Agent, or Firm* — Richard T. Ogawa; Ogawa P.C.

(57) ABSTRACT

Techniques for realizing compound semiconductor (CS) optoelectronic devices on silicon (Si) substrates for vehicle applications are disclosed. The integration platform is based on heteroepitaxy of CS materials and device structures on Si by direct heteroepitaxy on planar Si substrates or by selective area heteroepitaxy on dielectric patterned Si substrates. Following deposition of the CS device structures, device fabrication steps can be carried out using Si complimentary metal-oxide semiconductor (CMOS) fabrication techniques to enable large-volume manufacturing. The integration platform can enable manufacturing of optoelectronic devices including photodetector arrays for image sensors and vertical cavity surface emitting laser arrays. Such devices can be used in various applications including light detection and ranging (LIDAR) systems for vehicle apparatuses such as automobiles, boats, airplanes, and drones, and for other perception applications such as industrial vision, artificial intelligence (AI), augmented reality (AR) and virtual reality (VR).

18 Claims, 14 Drawing Sheets

(56) References Cited

OTHER PUBLICATIONS

B. Shi et al., "Defect engineering for high quality InP epitaxially grown on on-axis (001) Si", Journal of Applied Physics American Institute of Physics, 2 Huntington Quadrangle, Melville, NY 11747, vol. 127, No. 3, Jan. 16, 2020, XP012243895, ISSN: 0021-8979, DOI: 10.1063/1.5127030.
Q. Li et al., "Growing anitphase-domain-tree GaAs thin films out of highly ordered planar nanowire arrays on exact (001), silicon", Applied Physics Letters, American Institute of Physics, 2 Huntington Quadrangle, Melville, NY 11747, vol. 106, No. 7, Feb. 16, 2015, XP012194835, ISSN: 0003-6951, DOI: 10.1063/1.493432.
B. Shi et al., "MOCVD grown low dislocation density GaAs-on-V-groove patterned (001) Si for 1.3 [mu]m quantum dot laser applications," Applied Physics Letters, 2 Huntington Quadrangle, Melville, NY, 11747, vol. 114, No. 17, Apr. 30, 2019, XP012237487, ISSN: 0003-6951, DOI: 10.1063/1.5090437.
X. Jiang et al., "InGaAsP/InP Geiger-mode APD-based LiDAR", Proceedings of SPIE; ISSN 0277-786X; vol. 8615, SPIE, 1000 20th St. Bellingham, WA 98225-6705, USA, vol. 10729, Sep. 18, 2018.

\* cited by examiner

LIDAR SENSOR FOR VEHICLE APPARATUS

BACKGROUND OF THE INVENTION

Electronic devices have proliferated over the years. From an iPhone 12 designed and sold by Apple Inc. to advanced networks for selling almost any type of good by Amazon.com Inc., electronic devices have entered into almost every aspect of our daily lives. These devices rely on miniature chips made from semiconductor materials, commonly silicon ("Si"). These silicon materials are also used to make sensing devices that can capture images of objects or scenes. Silicon is widely used because it is an abundant material and silicon-based semiconductor manufacturing is mature due to the investments made in the electronics industry. A common technology process is called complementary metal oxide semiconductor, or "CMOS." The CMOS technology was developed for manufacturing integrated circuits but is now used for image sensors. Such image sensors are called CMOS image sensors. Often times, such CMOS image sensors are manufactured using high-volume manufacturing with 12-inch silicon wafers.

Despite the advances with CMOS image sensors, limitations or drawbacks exist. For example, CMOS image sensors have limitations in the detectable wavelength range. Additionally, such CMOS image sensors suffer from poor sensitivity at longer wavelengths within the detectable wavelength range. These and other limitations may also exist.

From the above, it is desired that industry develop improved sensing devices.

BRIEF SUMMARY OF THE INVENTION

The present invention is generally related to electronic devices. More specifically, the present invention provides techniques related to optoelectronic devices for vehicle applications such as, but not limited to, photodetectors and photodetector array circuits using heteroepitaxy of compound semiconductor ("CS") materials on silicon, along with subsequent circuit fabrication and integration methods. Merely by way of example, the present invention can be applied to various applications including image sensing, range finding, including LIDAR (light detection and ranging), among others, but it will be recognized that there are many other applications.

According to an embodiment, the present invention provides a vehicle apparatus configured with LIDAR functionality. The vehicle apparatus includes a vehicle with a drive mechanism configured to spatially move the vehicle (e.g., from a first location to a second location). The vehicle can include any type of automobile, watercraft, aircraft, hybrid vehicle, unmanned vehicle, or the like. The drive mechanism can include various types of power sources (e.g., engines, motors, batteries, etc.) configured to moving mechanisms (e.g., wheels, propellers, legs, etc.).

One or more module devices can be configured to an exterior region of the vehicle (e.g., a roof portion, a front portion, a side portion, a back portion, etc.). The module device can have a housing with an exterior region and an interior region. The exterior region includes a sensing portion and a detecting portion.

The sensing portion of the module device can be coupled to a laser device (or laser array) configured to emit electromagnetic radiation. This laser can be spatially disposed to include an aperture configured on the sensing portion of the exterior region of the housing. The electromagnetic radiation emission can have a wavelength range between 850 nm to 1550 nm. The laser device can be a VCSEL (vertical cavity surface emitting laser) array device, an EEL (edge emitting laser) device, a laser device coupled to a mirror device, or the like.

The detecting portion of the module device can be coupled to an image sensor device configured to detect photons and convert them to electrical signals. This image sensor can be spatially disposed to include an aperture configured on the detecting portion of the exterior region of the housing. The image sensor can be coupled to a logic/readout circuit and the laser can be coupled to the laser driver. These devices can be configured within the same integrated circuit device.

The module device can further include a classifier module coupled within the interior region of the housing. In an example, the classifier module can be coupled to the logic/readout circuit to further process the data collected by the image sensor. This classifier module can include a classification of one or more classes including a speed sensing, image sensing, facial recognition, distance sensing, acoustics sensing, thermal sensing, color sensing, biosensing (i.e., via a biological sensor), gravitational sensing, mechanical motion sensing, or other similar sensing types.

In a specific embodiment, the image sensor includes a photodetector device, which includes, among other elements, a first terminal and a second terminal. The photodetector device includes a Si substrate comprising a surface region. The device has a buffer material comprising a CS material deposited on the surface region of the Si substrate using direct heteroepitaxy such that the CS material is characterized by a first bandgap characteristic, a first thermal characteristic, a first polarity, and a first crystalline characteristic, and the Si substrate is characterized by a second bandgap characteristic, a second thermal characteristic, a second polarity, and a second crystalline characteristic. The device has an array of photodetectors, the array being characterized by N and M pixel elements, where N is an integer greater than 7, and M is an integer greater than 0.

In an embodiment, each of the pixel elements has various features. In an embodiment, each pixel element has a characteristic length ranging from 0.3 micrometers to 50 micrometers. In an embodiment, each pixel element has a preferred characteristic length ranging from 0.3 micrometers to 50 micrometers. In an embodiment, each of the photodetectors comprises an n-type material comprising an indium phosphide (InP) material comprising an Si impurity having a concentration ranging from $3E17$ $cm^{-3}$ to $8E18$ $cm^{-3}$, an absorption material overlying the n-type material, the absorption material comprising indium gallium arsenide (InGaAs) containing material, the absorption material being primarily free from an impurity, a p-type material overlying the absorption material, the p-type material comprising a zinc impurity or a beryllium impurity having a concentration ranging from $3E17$ $cm^{-3}$ to $5E18$ $cm^{-3}$, a first electrode coupled to the n-type material and coupled to the first terminal, and a second electrode coupled to the p-type material and coupled to the second terminal to define a two terminal device. The device has an illumination region characterized by an aperture region to allow a plurality of photons to interact with the CS material and be absorbed by a portion of the absorption material to cause a generation of mobile charge carriers that produce an electric current between the first terminal and the second terminal.

Optionally, the device has a responsivity (Amperes/Watt) greater than 0.1 Amperes/Watt characterizing the circuit, and a photodiode quantum efficiency greater than 10% characterizing the circuit.

Benefits or advantages are achieved over conventional techniques. The integration platform based on heteroepitaxy of CS materials and device structures on Si by direct or selective heteroepitaxy enables large-volume manufacturing of optoelectronic devices, such as image sensor and laser arrays, for use in vehicle applications. These devices fabricated using the present techniques can exhibit improved detectable wavelength range, higher sensitivity, and other related performance metrics. These and other benefits or advantages are described throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1A:
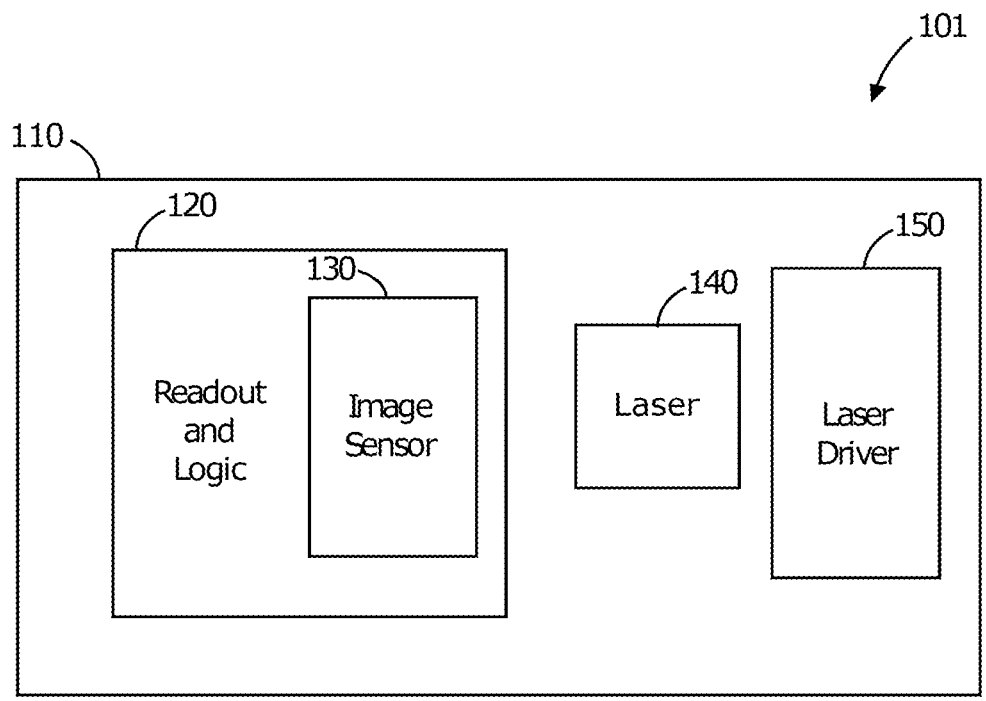
FIG. 1A is a simplified diagram of a top-view of a LIDAR device for a vehicle apparatus according to an example of the present invention.

The present invention is generally related to electronic devices. More specifically, the present invention provides techniques related to optoelectronic devices for vehicle applications such as, but not limited to, photodetectors and photodetector array circuits using heteroepitaxy of CS materials on Si, along with subsequent circuit fabrication and integration methods. Merely by way of example, the present invention can be applied to various applications including image sensing, range finding, including LIDAR, among others, but it will be recognized that there are many other applications.

In an example, the present invention provides method and device for realizing highly manufacturable and scalable semiconductor optoelectronic devices, including photodetector circuit arrays, on Si substrates that can be implemented in a variety of vehicle apparatuses. By directly depositing CS materials on Si substrates, mature Si microelectronics manufacturing processes can be leveraged to fabricate high performance photodetector circuits. Deposition on 12-inch Si substrates, which are common for CMOS technologies, enables the subsequent fabrication in CMOS manufacturing lines, however, the technology is not limited to 12-inch Si substrates only. CS materials can be deposited directly onto Si substrates with the techniques described in the present invention.

The technique to describe the direct deposition of CS materials is referred to herein as heteroepitaxy. The heteroepitaxy step or steps may be carried out with techniques including, but not limited to, metalorganic chemical vapor deposition (MOCVD), molecular beam epitaxy (MBE), metalorganic MBE (MOMBE), chemical beam epitaxy (CBE), hydride vapor phase epitaxy (HVPE), liquid phase epitaxy (LPE), or any combination thereof.

In addition to Si substrates, alternative substrates may be used including, but not limited to, silicon on insulator (SOI), miscut Si, SOI on miscut Si, or germanium (Ge) on Si, without departing from the scope of the invention.

In an embodiment of the present invention, CS material is deposited onto a Si substrate by heteroepitaxy, by firstly depositing a buffer material that includes an initial nucleation on the Si surface and enables the trapping, annihilation, and/or filtering of defects near the interface between the CS material and the Si surface. The initial nucleation step may be carried out at a relatively low temperature, and the subsequent buffer material growth intended to trap, annihilate and/or filter defects may be carried out at a higher temperature. Surface treatment may be carried out prior to the initial nucleation on the Si surface. This treatment may include, but is not limited to, chemical cleaning and/or treatment of the Si surface, reordering of the Si surface with high-temperature annealing in an ambient, high-temperature annealing in an ambient to remove and/or treat a surface oxide, or the formation of various Si crystal planes by treatment or etching.

The initial nucleation and buffer growth can be carried out with a number of methodologies, and combinations of methodologies, including, but not limited to, initial group IV (e.g., Si or Ge material) growth for surface reordering or reparation followed by CS growth for defect trapping, or Si surface patterning or structuring, that may include formation of various Si crystal planes, followed by CS nucleation and growth, or low-temperature CS nucleation, or low-temperature CS nucleation followed by multi-step growth with temperature grading for defect bending and annihilation, or use of strained layer superlattices, interfaces with high strain fields, graded or step-graded layers, or other similar techniques to redirect, trap, convert, and/or annihilate defects.

The techniques of the present invention can be used to manufacture various optoelectronic devices in high volumes by leveraging Si manufacturing methods. These devices include, but are not limited to, lasers that are either edge-emitting or vertical cavity surface emitting, optical modulators, photodetectors or photodiodes, semiconductor optical amplifiers, and nonlinear devices for optical comb or frequency generation. Specific to image sensors and photodetector circuit arrays, various device structures could be realized by heteroepitaxy deposition of device layers and subsequent fabrication steps. These device structures include, but are not limited to, planar photodiodes, mesa photodiodes, double mesa photodiodes, PIN or NIP photodiodes, avalanche photodiodes (APDs), and uni-traveling-carrier (UTC) photodiodes.

The optoelectronic devices and device arrays realized with deposition of CS materials on Si can be leveraged in various applications, including, but not limited to, LIDAR; LIDAR for autonomous vehicles including, but not limited to, automobiles, aerial vehicles, airplanes, jets, drones, robotic vehicles; advanced driver assistance systems (ADAS); LIDAR for mobile devices including, but not limited to, phones and tablets; imaging for camera applications including, but not limited to, digital cameras, mobile phones, tablets; imaging and perception for robots, artificial intelligence (AI) applications, augmented reality (AR) applications, and virtual reality (VR) applications; 3D imaging and sensing; defense and aerospace; industrial vision, factory automation; medical and biomedical imaging; topography, weather, and wind mapping; gas sensing; infrared (IR) imaging; smart building, security, people counting; thermal imaging, thermography; heating, ventilation and air conditioning (HVAC);

In addition to the group III-V CS materials, the techniques of the present invention could apply to other materials for photodetector circuits including, but not limited to, II-VI compounds, IV-VI compounds, II-V compounds, or IV-IV compounds.

In another embodiment, the CS nucleation, buffer materials and subsequent photodetector materials may be deposited and formed by selective area heteroepitaxy, whereby the Si or similar substrate could be first patterned with a dielectric to form recesses, within which the CS nucleation, the buffer materials and the photodetector materials could be selectively deposited. Selective area heteroepitaxy is the process by which the Si substrate would be patterned with a dielectric, and the subsequent deposition of semiconductor materials would deposit selectively on the exposed Si surfaces but not on the dielectric surfaces. Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

Figure 1B:
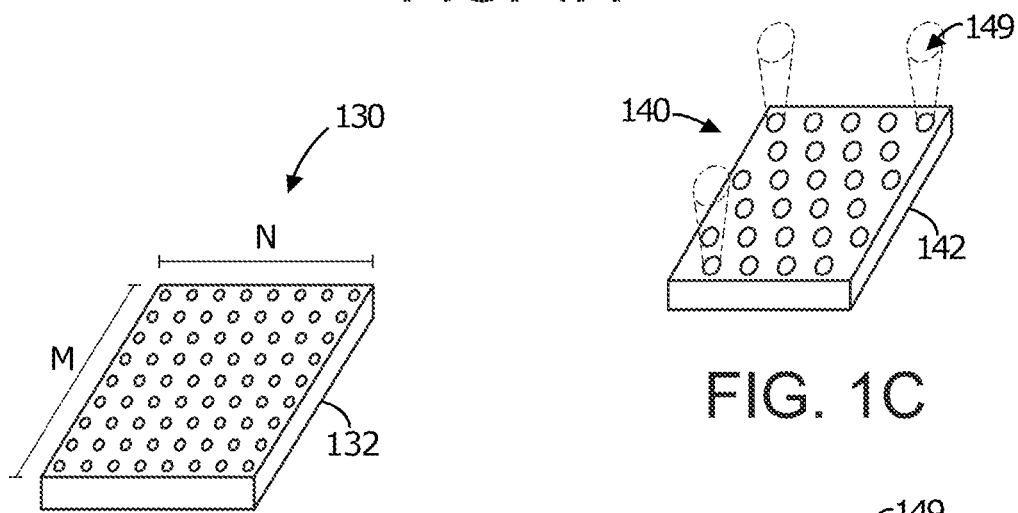
FIG. 1B is a simplified diagram of a perspective view of an example image sensor array chip of the LIDAR device shown in FIG. 1A.
Figure 1C:
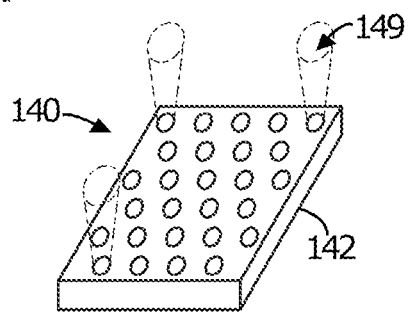
FIG. 1C is a simplified diagram of a perspective view of an example laser chip of the LIDAR device shown in FIG. 1A.
Figure 1D:
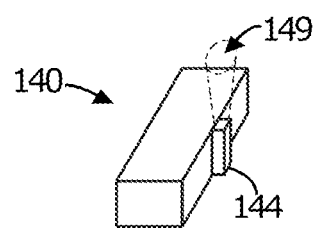
FIG. 1D is a simplified diagram of a perspective view of an example laser chip of the LIDAR device shown in FIG. 1A.

The techniques described above can be applied to an integrated circuit configured for a vehicle apparatus. FIG. 1A is a simplified diagram of a top-view of a LIDAR device for a vehicle apparatus according to an example of the present invention. As shown, device 101 includes a circuit board 110 (e.g., printed circuit board (PCB), or the like) with a readout/logic device 120, an image sensor device 130, a laser device (or laser array) 140, and a laser driver 150 configured on top. In this case, the image sensor chip 130 is bonded face-down overlying the readout/logic chip 120. The laser array chip 140, configured by its associated laser driver 150, emits one or more output beams that are reflected off of a target and return to be imaged by the image sensor chip 130. FIGS. 1B-1D show additional details or variations for certain components of device 101. FIG. 1B shows a perspective view of an example image sensor chip 130 configured as an array 132 with M×N pixel elements. The laser array chip 140 can be a VCSEL (vertical cavity surface emitting laser) array 142, as shown in FIG. 1C, an EEL (edge emitting laser) 144, as shown in FIG. 1D, or the like. Example output beams 149 are shown by dotted lines in both examples.

Figure 1E:
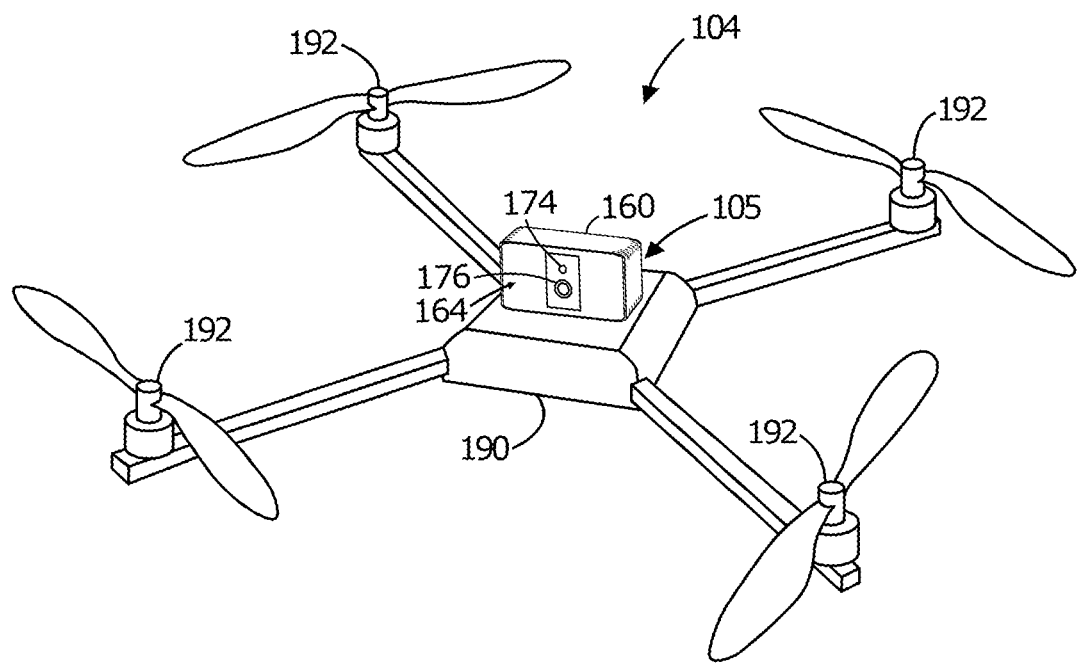
FIG. 1E is a simplified diagram of a front perspective view of a vehicle apparatus with integrated image-sensing according to an example of the present invention.
Figure 1F:
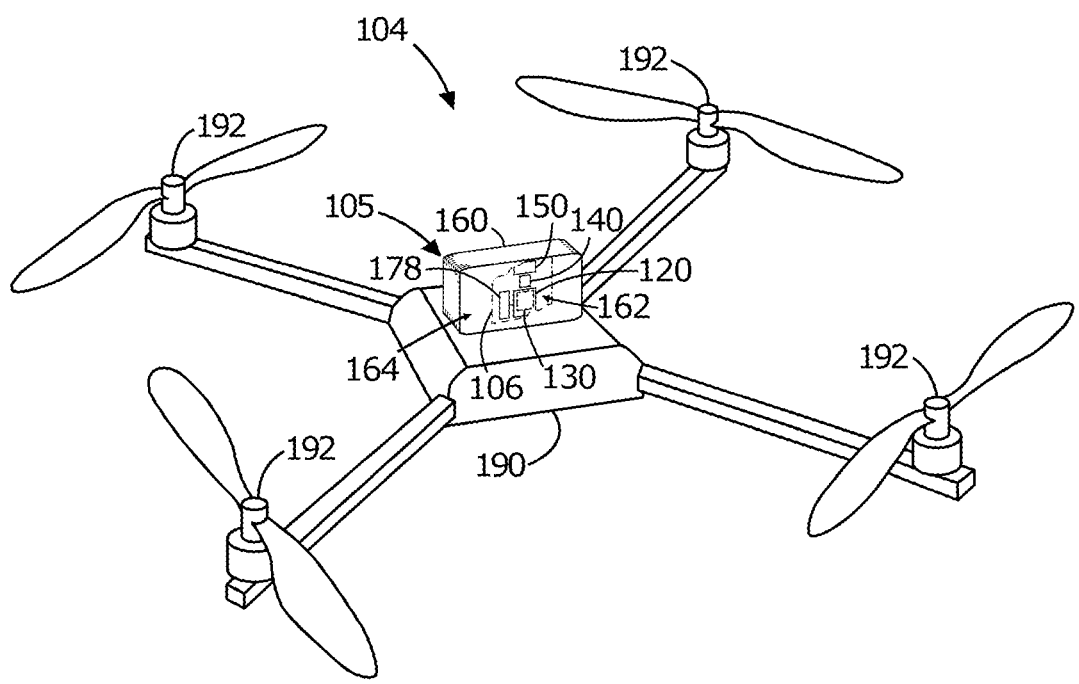
FIG. 1F is a simplified diagram of a back perspective view of a vehicle apparatus with integrated image-sensing according to an example of the present invention.

According to an example, the present invention provides a vehicle apparatus 104 configured with LIDAR functionality. As shown in FIG. 1E (front perspective view) and FIG. 1F (back perspective view), an example vehicle apparatus 104 includes a vehicle with a drive mechanism configured to spatially move the vehicle (e.g., from a first location to a second location). In this case, the vehicle is a quadcopter-type drone 190, and the drive mechanism includes rotors 192, each of which can be powered by a motor. The vehicle can include any type of automobile, watercraft, aircraft, hybrid vehicle, unmanned vehicle, or the like. In a specific example, the vehicle can be selected from a boat, a drone, an airplane, a truck, an automobile, an autonomous vehicle, or the like. The drive mechanism can include various types of power sources (e.g., engines, motors, batteries, etc.) configured to moving mechanisms (e.g., wheels, propellers, legs, etc.). Those of ordinary skill in the art will recognize the variations, modifications, and alternatives to such vehicle types and their associated drive mechanisms.

One or more module devices can be configured to an exterior region of the vehicle 190 (e.g., a roof portion, a front portion, a side portion, a back portion, an underside portion, etc.). Here, the module device 105 is configured on top of the vehicle 190 and includes a housing 160 with an exterior region 162 and an interior region 164. The exterior region includes a sensing portion 174 and a detecting portion 176. In this case, the sensing portion 174 and the detecting portion 176 are configured of the front-side of the exterior region 162. There can be other configurations, such as having the sensing and detecting portions 172, 174 on the back side and/or both left and right sides of the module housing 160 or having additional module devices on different portions of the vehicle exterior region.

The sensing portion 174 of the module device 105 can be coupled to a laser device 140 configured to emit electromagnetic radiation. This laser 140 can be spatially disposed to include an aperture configured on the sensing portion 174 of the exterior region of the housing 160. In an example, the electromagnetic radiation emission can have a wavelength range between 850 nm to 1550 nm. In a specific example, the wavelength range is 940 nm. The laser device 140 can be a VCSEL array device (see FIG. 1C), an EEL device (see FIG. 1D), a laser device coupled to a mirror device, or the like.

The detecting portion 176 of the module device 105 can be coupled to an image sensor device 130 configured to detect photons and convert them to electrical signals. This image sensor can be spatially disposed to include an aperture configured on the detecting portion 176 of the exterior region 162 of the housing 160. The image sensor 130 and laser 140 can be configured similar to the integrated circuit device 101 shown in FIG. 1A. As shown in the interior region 164 (dotted line cutaway 106 in FIG. 1E), the image sensor 130 is electrically coupled to a logic/readout circuit 120. In this case, the image sensor 130 is facing the back-side of the device 105 (indicated by dotted lines). Further, the laser 140 is electrically coupled to the laser driver 150.

The module device 105 can further include a classifier module 178 coupled within the interior region 164 of the housing 160. In an example, the classifier module 178 can be coupled to the logic/readout circuit 120 to further process the data collected by the image sensor 130. This classifier module 178 can include a classification of one or more classes including a speed sensing, image sensing, facial recognition, distance sensing, acoustics sensing, thermal sensing, color sensing, biosensing (i.e., via a biological sensor), gravitational sensing, mechanical motion sensing, or other similar sensing types.

In an example, the image sensor 130 is a photodetector circuit that includes a CS material stack formed overlying a Si substrate. This material stack can include a buffer material and an array of photodetectors configured from an n-type material, an absorption material, and a p-type material. Each photo detector also includes an illumination region, a first electrode coupled to the n-type material and a first terminal, and a second electrode coupled to the p-type material and a second terminal. Further details of the photodetector circuit are discussed in reference to the remaining figures.

This module device 105 can also be configured for virtual reality (VR), a mobile phone, a smartphone, a tablet computer, a laptop computer, a smart watch, an e-reader, a handheld gaming console, or other mobile computing device. Those of ordinary skill in the art will recognize other variations, modifications, and alternatives to the device configurations and applications discussed previously.

Figure 1G:
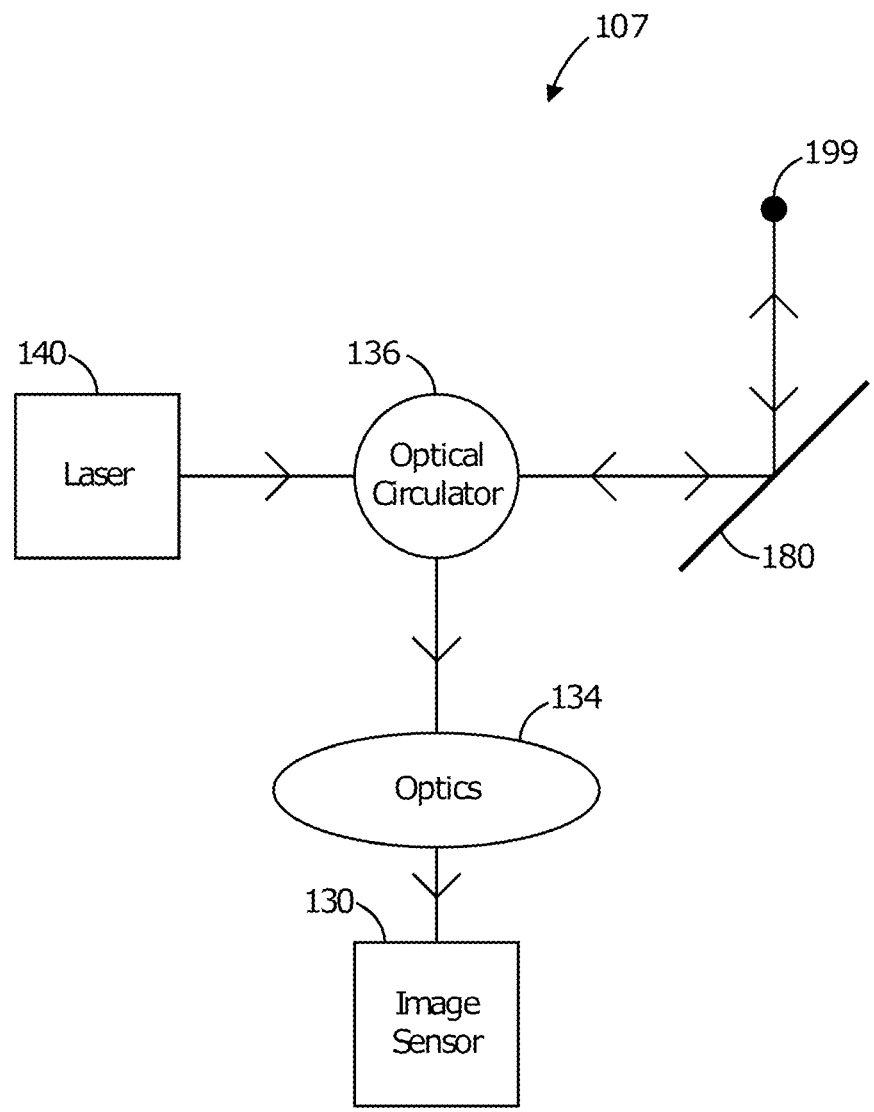
FIG. 1G is a simplified block diagram of a LIDAR system according to an example of the present invention.

FIG. 1G is a simplified block diagram illustrating a LIDAR system according to an example of the present invention. As shown, system 107 includes an image sensor device 130, optics 134, a laser device (or laser array) 140, a movable mirror 180 optically coupled to an optical circulator 136. In this configuration, the movable mirror 180 can steer one or more outgoing beams coming from the laser 140 (through the optical circulator 136) to an object/point of reflection 199. Then, one or more return beams from that object/point of reflection 199 are imaged with the image sensor 130 (i.e., reflected back from the movable mirror 180 and directed by the optical circulator 136 through the optics 134 to the image sensor 130). Using this optical path between these elements (shown by the lines with directional arrows), the movable mirror 180 may steer in 2D to enable 3D imaging of a scene or object. Of course, there can be other variations, modifications, and alternatives to this example LIDAR system.

Figure 2A:
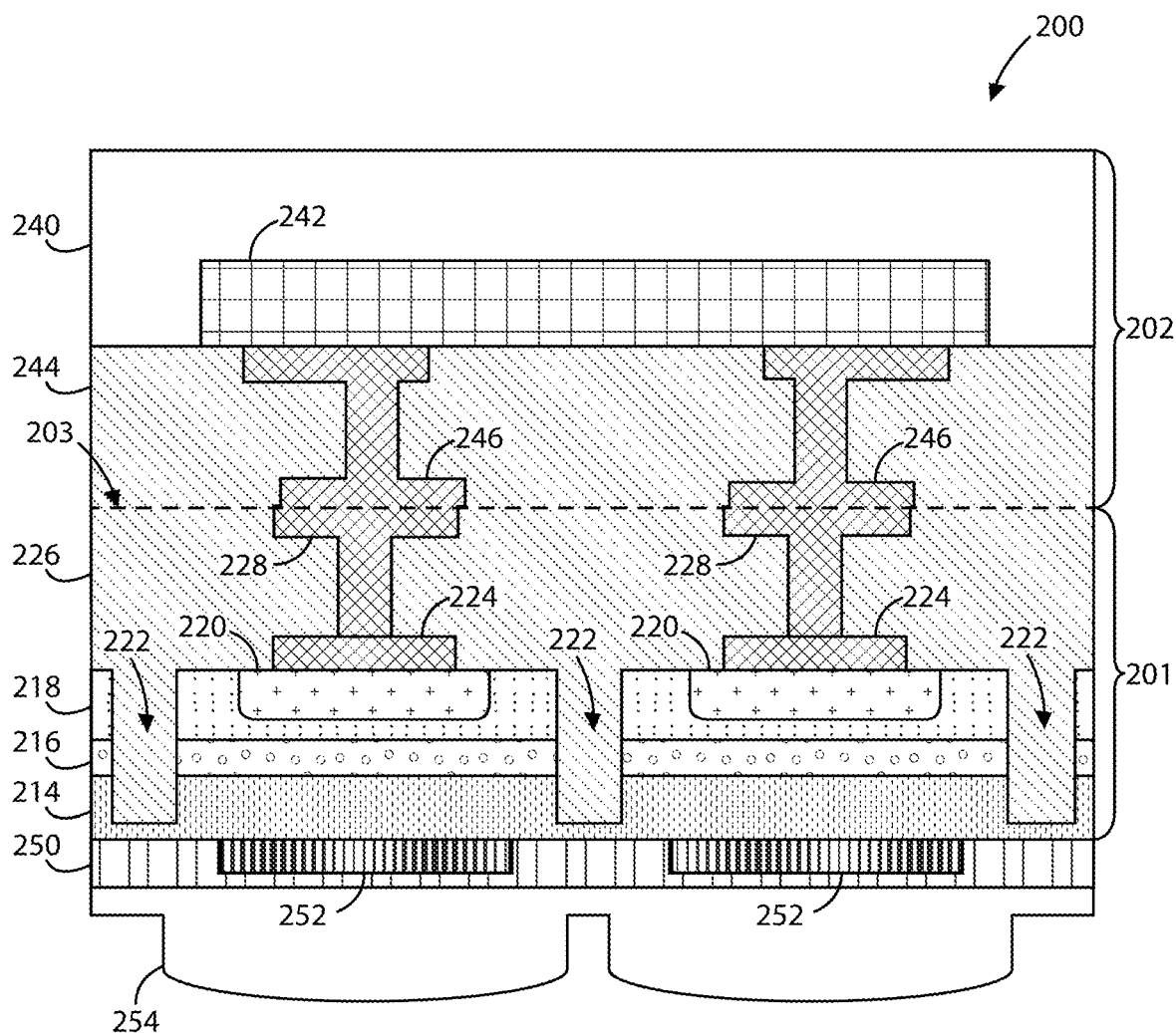
FIG. 2A is a simplified diagram of a circuit device including a photodetector array circuit coupled to a readout circuit according to an example of the present invention.

FIG. 2A is a simplified diagram of a circuit device 200 including a photodetector array circuit 201 coupled to a readout circuit 202 according to an example of the present invention. As shown, the photodetector circuit 201 is bonded to the CMOS readout circuit 202 at the bond interface 203. The steps for front-end fabrication of the photodetector circuit and the CMOS circuit may vary in detail or order, without departing from the scope of the invention. In an example, each photodetector device structure in the array 201 is formed with an n-type CS material 214, a CS absorption material 216, a p-type CS material 220 (configured within a CS material 218), a p-metal contact 224 coupled to a first terminal 228 (i.e., the anode), and an n-metal contact coupled to a second terminal 230 (i.e., the cathode). The n-metal contact/second terminal coupling may be made from the topside of the photodetector circuit, or from the backside, without departing from the scope of the invention. These photodetector devices can be separated by isolation trenches 222.

Figure 2B:
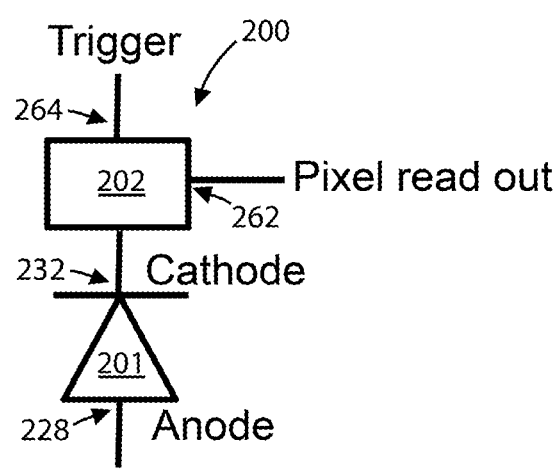
FIG. 2B is a simplified circuit diagram of the photodetector array circuit coupled to the readout circuit shown in FIG. 2A.

The readout circuit 202 comprises a Si substrate 240, which can include the readout integrated circuits (ROIC) 242 and other front-end integrated circuits (ICs). The metal layers of the readout circuit 202 within the dielectric layer 244 can include terminals (e.g., first input terminals 246 and second input terminals) that connect to the anode terminals 228 and cathode terminals 230 of the photodetector 201 at the bond interface 203. FIG. 2B shows a simplified circuit diagram representation of device 200 with the photodetector 201 coupled to the readout circuit 202 with terminals for pixel read out 262 and triggering 264. Those of ordinary skill in the art will recognize other variations, modifications, and alternatives to the configuration for metal contacts and terminal connections.

The steps for the backend fabrication, including bonding, backside contact, optical coating, color filter integration, or lens attachment, may vary in detail or order, without departing from the scope of the invention. In an example of the invention, the Si handle substrate and some of the CS materials (see substrate 210 and CS buffer material 212 in FIG. 3) are removed from the backside of the photodetector circuit following face-to-face bonding to the Si CMOS circuit. This removal process can be used to form an illumination region configured to allow light to interact with the photodetector materials (e.g., CS absorption material). An optical coating 250 and/or color filters 252 may be applied to the n-type CMOS material to assist in defining the illumination apertures for pixel elements. A lens array 254 may be coupled to the optical coating 250/color filter 252 for increasing the coupling of light to each pixel element to improve the responsivity of the photodetector circuit. The photodetector circuit of FIG. 2 represents a back side illuminated (BSI) photodetector. A modified front side illuminated (FSI) photodetector circuit may be realized by CS heteroepitaxy on Si without departing from the scope of the invention.

Figure 3:
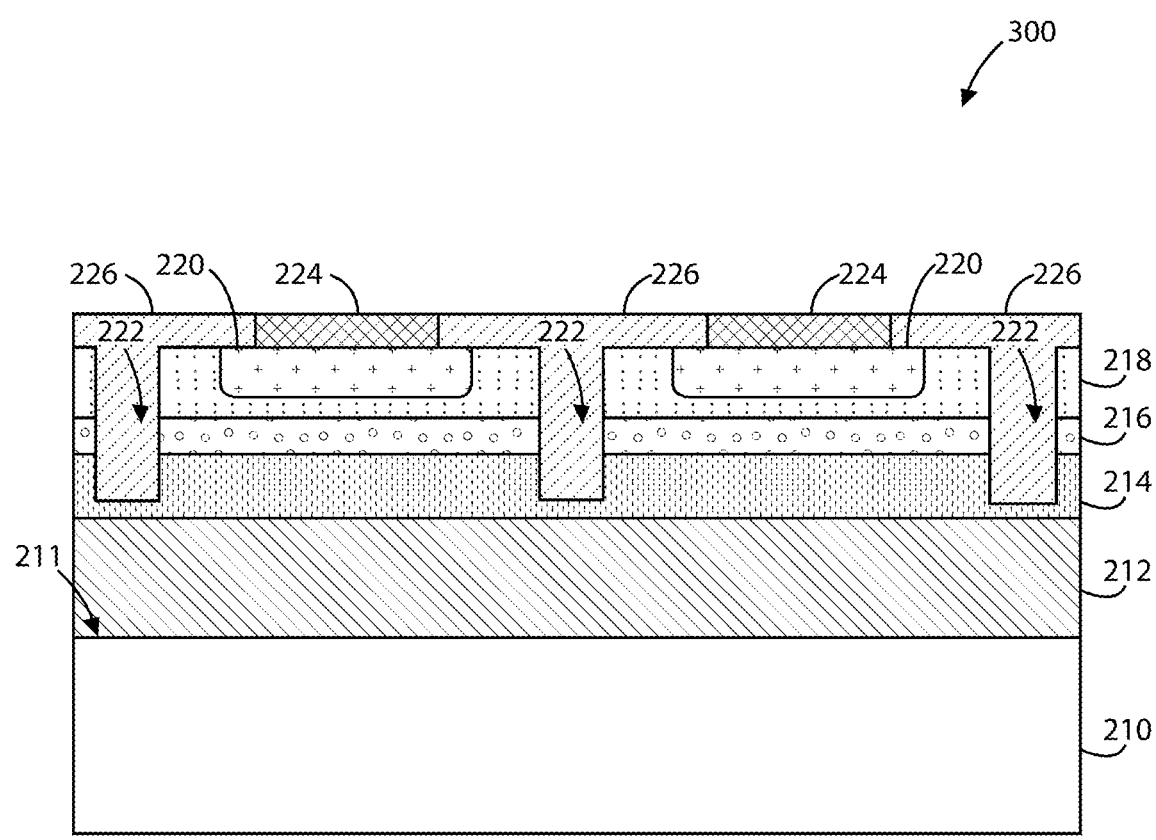
FIG. 3 is a simplified diagram of a photodetector circuit device according to an example of the present invention.

FIG. 3 is a simplified diagram of a photodetector array circuit device 300 according to an embodiment of the present invention. As discussed previously, the present invention can include depositing CS materials overlying a Si substrate by heteroepitaxy to form a CS material stack. Device 300 can represent a prior fabrication stage of the photodetector array circuit (device 201 of FIG. 2) that is bonded to the CMOS circuit (device 202 of FIG. 2). Here, a CS buffer material 212 is spatially configured overlying the Si surface 211 of the Si substrate 210. Photodetector device materials, including an n-type CS material 214, an CS absorption material 216, a CS material 218, are spatially configured overlying the CS buffer material 212. One or more p-type CS regions 220 are configured within one or more portions of the CS material 218. One or more isolation trenches 222 are configured within portions of the photodetector device materials (i.e., layers 214, 216, and 218) and filled with a dielectric material 226 for optical or electrical isolation, or alternatively or inclusively with other material such as a metal, which can separate individual CS photodetector devices of the array.

Each of the photodetectors can be configured with metal contacts (or electrodes) to the n-type CS material 214 and to the p-type CS materials 220. In FIG. 3, a p-contact metal 224 is configured overlying each of the p-type CS materials 220, and, although not shown, n-contact metals can be coupled to the n-type CS material 214. The n-metal contact and coupling may be made from the topside of the photodetector circuit 212, or from the backside, without departing from the scope of the invention. The p-contact metals 224 can be further coupled to a first terminal 228 (e.g., an anode), and the n-contact metals can be coupled to a second terminal (e.g., a cathode).

According to an example, the present invention provides a circuit for a photodetector. The photodetector circuit includes a buffer material formed (or deposited) overlying a surface region of a Si substrate, or the like. This buffer material can include a CS material deposited on the surface region of the Si substrate using direct heteroepitaxy such that the CS material is characterized by a first bandgap characteristic, a first thermal characteristic, a first polarity, and a first crystalline characteristic. Compared to the buffer material, the Si substrate is characterized by a second bandgap characteristic, a second thermal characteristic, a second polarity, and a second crystalline characteristic.

In a specific example, the CS material can include InP, InGaAs, gallium arsenide (GaAs), gallium phosphide (GaP), indium gallium arsenide phosphide (InGaAsP), indium aluminum gallium arsenide (InAlGaAs), indium arsenide (InAs), indium gallium phosphide (InGaP), or a combination thereof.

The photodetector circuit also includes an array of photodetectors. This array is characterized by N and M pixel elements (i.e., N×M array; N>0, M>0). In a specific example, N is an integer greater than 7, and M is an integer greater than 0. Each of these pixel elements has a characteristic length ranging from 0.3 micrometers to 50 micrometers. Also, each of the photodetectors includes an n-type material, an absorption material overlying the n-type material, and a p-type material overlying the absorption material.

In a specific example, the n-type material can include an InP material with a silicon impurity having a concentration ranging from $3E17$ $cm^{-3}$ to $5E18$ $cm^{-3}$. The absorption material can include an InGaAs containing material and can be primarily (or substantially) free from any impurity. And, the p-type material can include a zinc impurity or a beryllium impurity having a concentration ranging from $3E17$ $cm^{-3}$ to $5E18$ $cm^{-3}$.

In an alternative photodetector CS device structure, the n-type material includes a GaAs material comprising a silicon impurity having a concentration ranging from $3E17$ $cm^{-3}$ to $5E18$ $cm^{-3}$, the absorption material includes an InAs quantum dot material, and the p-type material includes a zinc impurity or a beryllium impurity or a carbon impurity having a concentration ranging from $3E17$ $cm^{-3}$ to $1E20$ $cm^{-3}$.

Additionally, the photodetector device structure can be configured with a separate absorption material comprising InGaAs or InGaAsP, and a multiplication material comprising InP whereby the multiplication material generates additional charge carriers by avalanche gain.

The photodetector circuit also includes a first electrode coupled to the n-type material and coupled to a first terminal, as well as a second electrode coupled to the p-type material and coupled to a second terminal. This configuration defines each photodetector as a two terminal device (i.e., having anode and cathode terminals).

The photodetector circuit also includes an illumination region characterized by an aperture region to allow a plurality of photons to interact with the CS material and be absorbed by a portion of the absorption material to cause a generation of mobile charge carriers that produce an electric current between the first terminal and the second terminal. In a specific example, the Si substrate is configured to allow the photons to traverse there through. The illumination region can also be configured to be free from any portion of the silicon substrate. A color filter can be configured overlying (or otherwise coupled to) the illumination region, and a lens can be configured overlying (or otherwise coupled to) the color filter.

Further, the photodetector circuit is characterized by a responsivity greater than 0.1 Amperes/Watt and a photodiode quantum efficiency greater than 10%. The photodetector circuit can be characterized as a BSI device or a FSI depending upon the application.

The photodetector circuit device can further include an analog front-end circuit, such as a ROIC, coupled to the array of photodetectors. The ROIC includes a first input terminal, a second input terminal, and a pixel output. The first and second input terminals are coupled to the first and second terminals of the photodetectors, respectively. The photodetector circuit can also include analog-to-digital conversion functionality (e.g., configured with or as part of the ROIC. There can be other variations, modifications, and alternatives to the elements and configurations discussed above.

Further details of example fabrication methods related to devices 200 and 300 are discussed below in reference to FIGS. 4-9.

FIGS. 4-9 are simplified diagrams illustrating methods of fabricating a compound semiconductor (CS) photodetector circuit device according to an example of the present invention. In these figures, shared reference numerals in subsequent figures refer to the same elements as described in previous figures.

Figure 4:
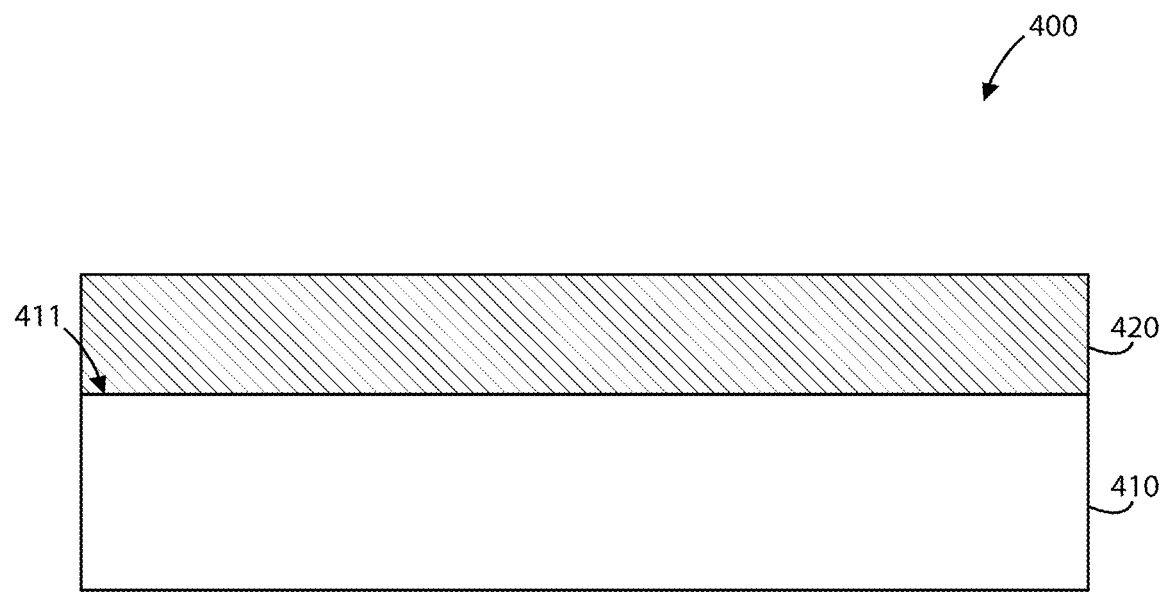
FIG. 4 is a simplified diagram of a device including CS buffer materials on a Si substrate realized by heteroepitaxy according to an example of the present invention.

FIG. 4 is a simplified diagram of a device 400 including CS buffer materials on a Si substrate realized by heteroepitaxy according to an example of the present invention. In this embodiment, a CS buffer material 420 is deposited overlying a surface region 411 of a Si substrate 410 in order to nucleate the CS material 420 and to trap and/or filter defects within the buffer material 420 and near the interface between the CS material 420 and Si surface 411. The initial nucleation and buffer material growth may be carried out with a number of methodologies, and combinations of methodologies, including, but not limited to, initial group IV material growth for surface reordering followed by group III-V CS growth for defect trapping; Si surface patterning or structuring, that may include formation of various Si crystal planes, followed by CS nucleation and growth; low-temperature CS nucleation; low-temperature CS nucleation followed by multi-step growth with temperature grading for defect bending and annihilation; use of strained layer superlattices, interfaces with high strain fields, graded or step-graded materials, or other similar techniques to redirect, trap, convert, and/or annihilate defects.

Figure 5:
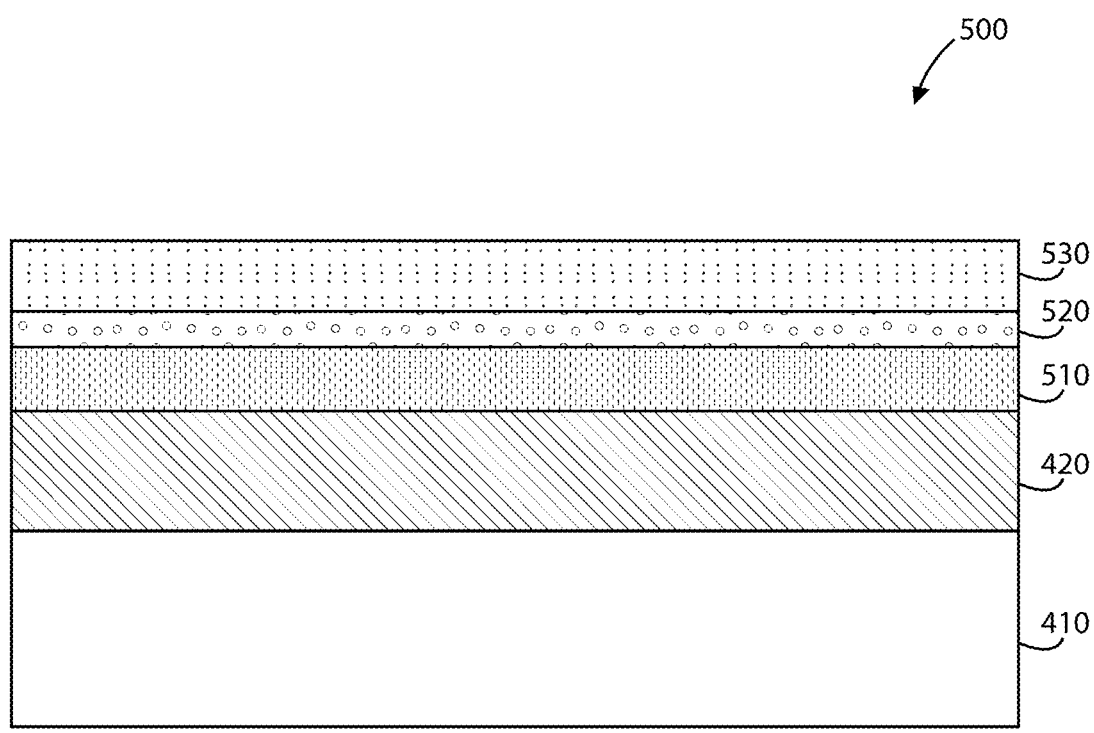
FIG. 5 is a simplified diagram of a device including CS buffer materials and CS device materials for a photodetector on a Si substrate realized by heteroepitaxy according to an example of the present invention.

As shown in device 500 of FIG. 5, following the formation of the CS buffer material 420, the photodetector device materials may be deposited overlying the CS buffer material 420 and Si substrate 410. The photodetector device materials can include an n-type CS material 510, a CS absorption material 520, and a CS material 530. In this embodiment, the CS device materials that are deposited overlying the buffer on Si (e.g., device 400 of FIG. 4) may form planar photodiode structures for the photodetector array circuit.

The n-type CS material 510 comprises a Si doping impurity and is formed overlying the buffer on Si. The CS absorption material 520, which is formed overlying the n-type material 510, is highly absorptive of light with a characteristic wavelength or wavelength range of interest. The absorption material 520 is primarily free from impurities. The CS material 530, which is formed overlying the absorption material 520, is deposited without intentional impurity. The various materials illustrated may comprise of band smoothing layers, diffusion block layers, a separate absorption layer, a charge layer, or a multiplication layer. Those of ordinary skill in the art will recognize other variations, modifications, and alternatives.

Figure 6:
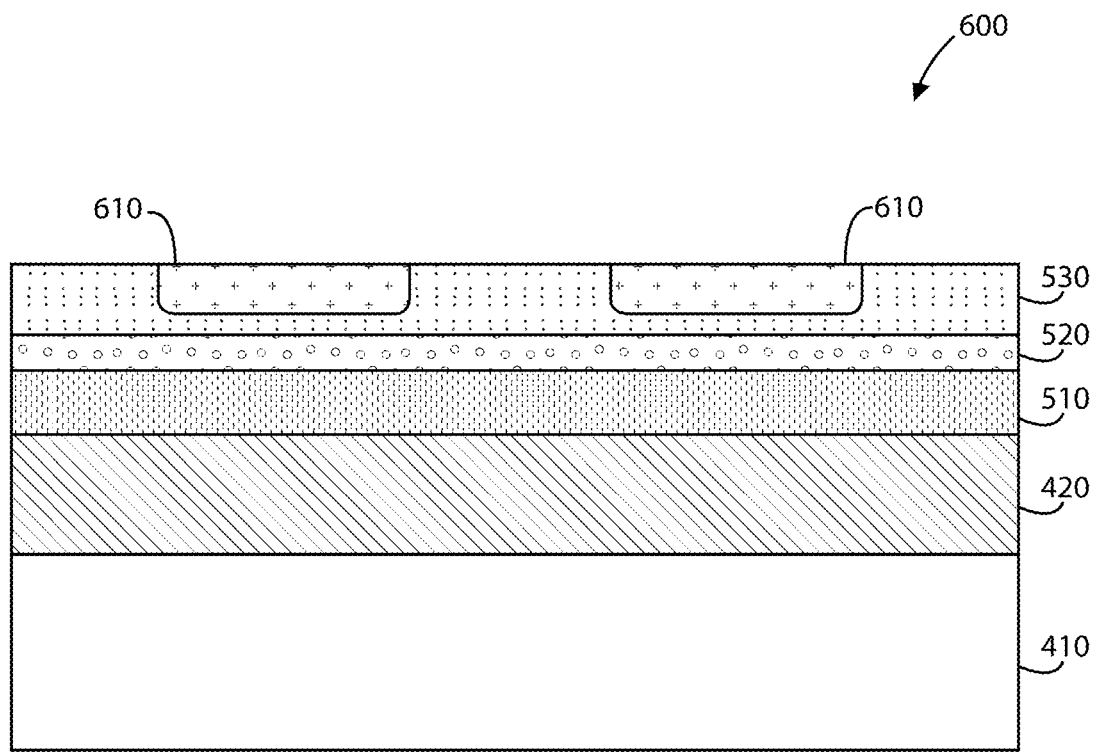
FIG. 6 is a simplified diagram of a device including CS buffer materials, CS device materials, and p-doped regions formed by diffusion, on a Si substrate realized by heteroepitaxy according to an example of the present invention.

As shown in device 600 of FIG. 6, the p-type material 610 for each photodetector is formed within a portion of the CS material 530. Depending on the specific CS material used for element 530, the p-type material 610 can be formed with diffusion of an impurity material that may be zinc, beryllium, or carbon, or the like.

Figure 7:
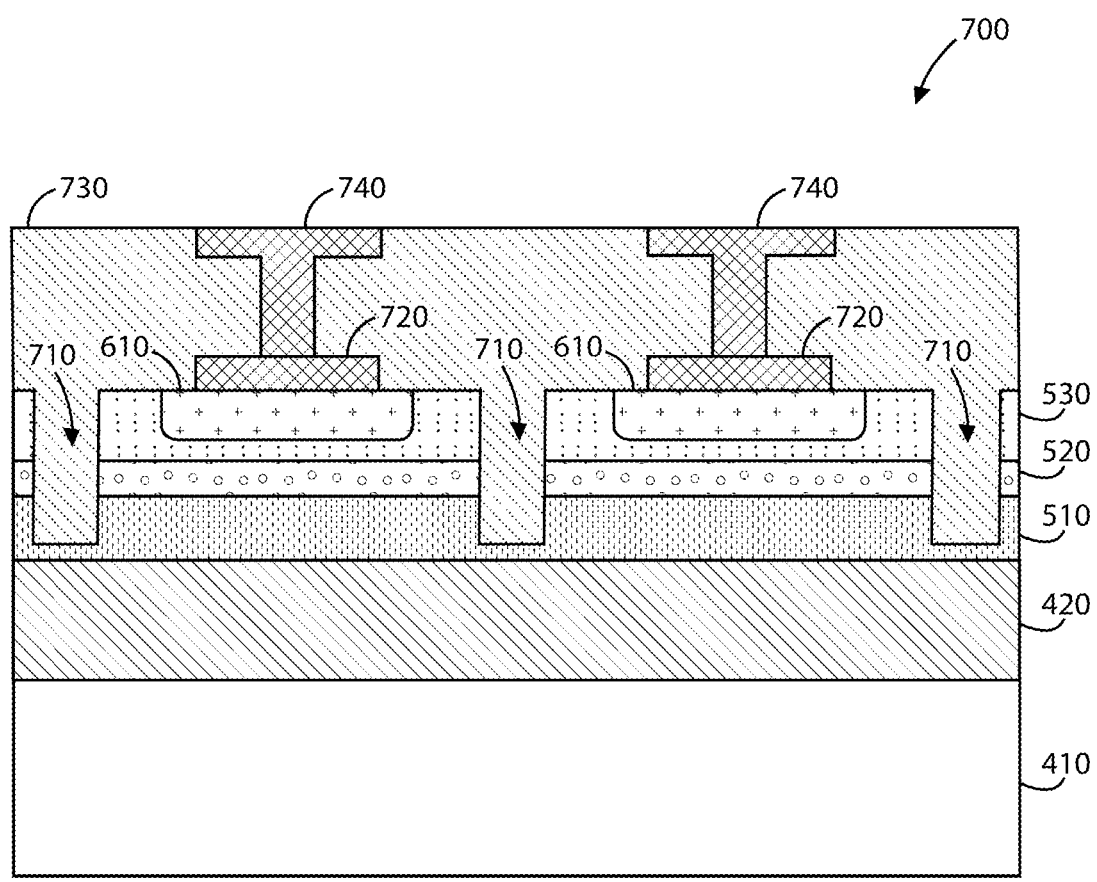
FIG. 7 is a simplified diagram of a device including CS buffer materials, CS device materials, p-doped regions formed by diffusion, isolation trenches, a planar film, metal contacts, vias, metal in vias, and top metal formed in trenches, on a Si substrate realized by heteroepitaxy according to an example of the present invention.

FIG. 7 illustrates the photodetector circuit 700 following the completion of the front-end fabrication steps (e.g., as shown previously in FIGS. 4-6). Isolation trenches 710 may be formed within portions of the photodetector device materials (i.e., layers 510-530) for optical or electrical isolation, and, in combination, to expose the n-type layer 510 (e.g., to form one or more n-contact metals). One or more p-contact metals 720 can be formed overlying the p-type materials 610. A dielectric material 730 may be deposited overlying the p-contact metals 720, the p-type materials 610, and the photodetector device materials. In this case, the dielectric material 730 also fills isolation trenches 710. Additional vias and trenches may be formed to expose the p-contact metals 720, and then the vias and trenches may be filled with metal materials 740 to provide metal connections to the p-contact metals 720 at the exposed surface region of the dielectric material 730. Of course, there can be other variations, modifications, and alternatives.

Photodetector device structures formed could include, but are not limited to, PIN photodiodes, APDs, UTC-PDs, mesa photodiodes, or planar photodiodes. Photodetectors could leverage bulk absorptive layers, including, but not limited to, InGaAs, InGaAsP, or could alternatively leverage quantum wells, quantum dashes, or quantum dots. Those of ordinary skill in the art will recognize other variations, modifications, and alternatives.

Figure 8:
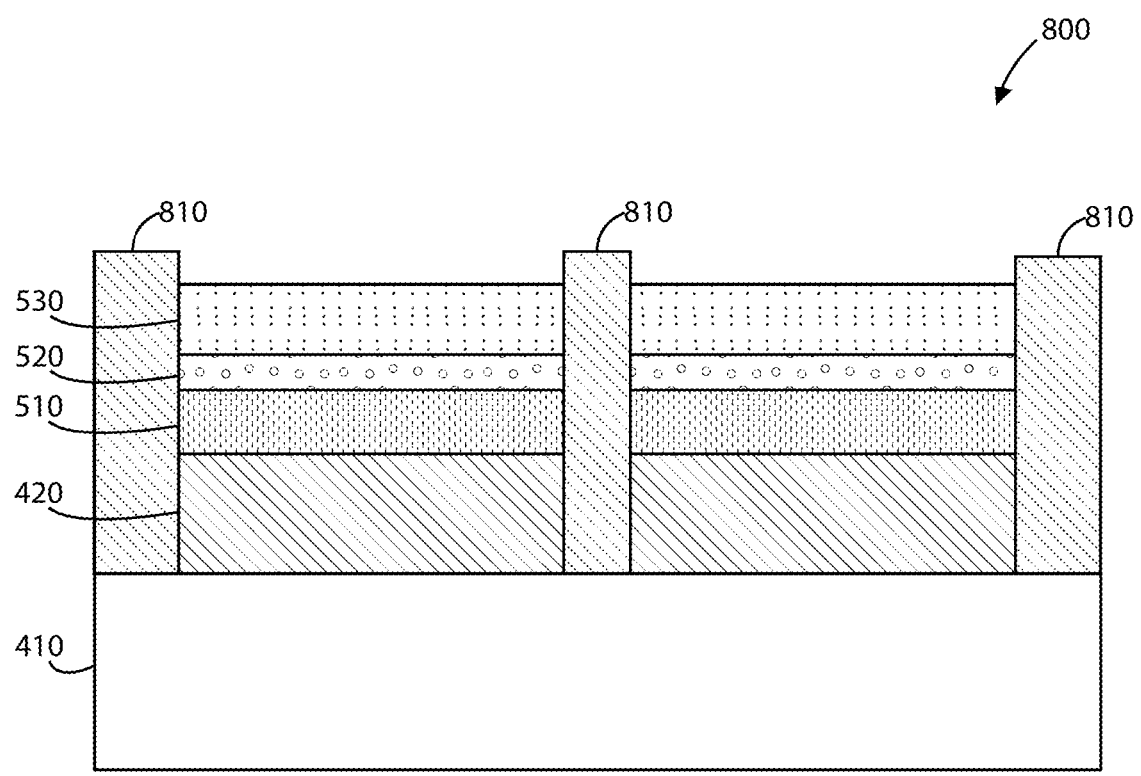
FIG. 8 is a simplified diagram of CS buffer materials and CS device materials deposited on a Si substrate realized by selective area heteroepitaxy that leverages a patterned dielectric according to an example of the present invention.
Figure 9:
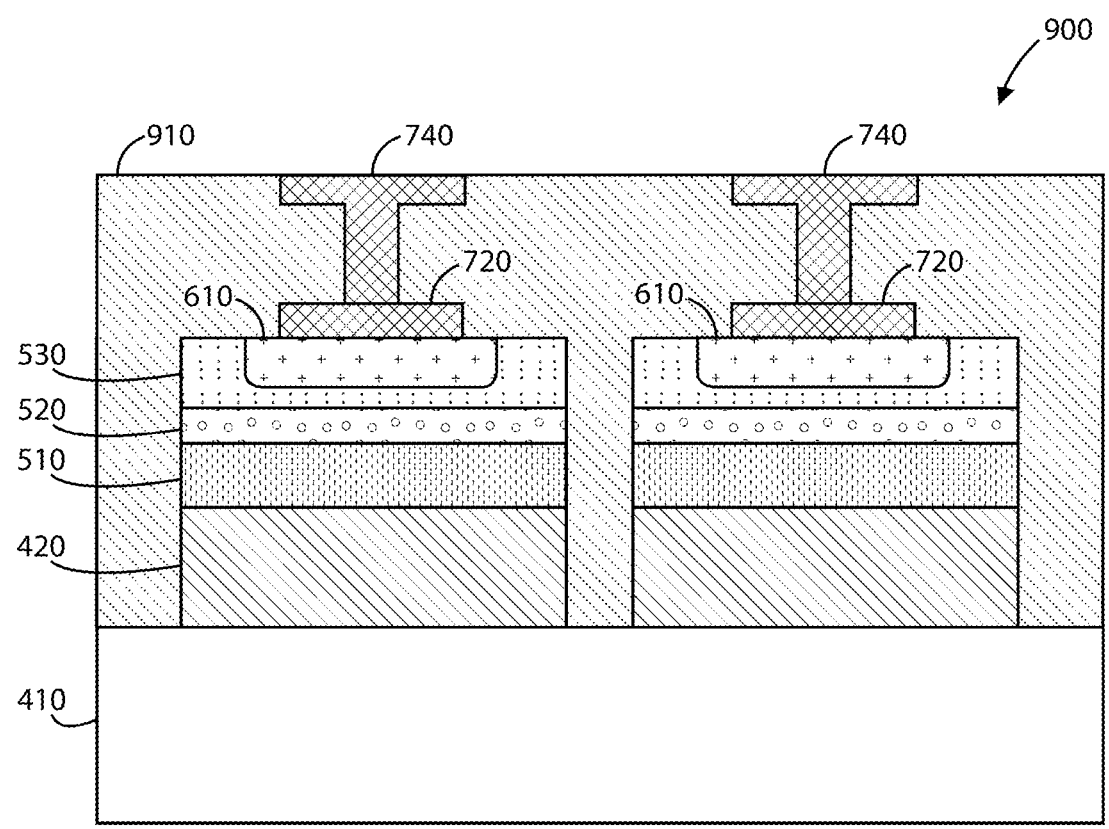
FIG. 9 is a simplified diagram of CS buffer materials, CS device materials, p-doped regions formed by diffusion, isolation trenches formed, a planar film formed, metal contacts formed, vias formed, metal in vias formed, and top metal formed in trenches, on a Si substrate realized by selective area heteroepitaxy, according to an example of the present invention.

FIG. 8 represents an alternative embodiment of a photodetector circuit 800 whereby the CS materials are deposited on the Si surface by selective area heteroepitaxy, whereby the Si surface is firstly patterned with a dielectric material 810 to form recesses, within which the CS materials would be selectively deposited on the exposed Si surface while not depositing on the dielectric material. The materials may comprise of similar or identical layers as those described for FIG. 7 (denoted by the same reference numerals). As illustrated in FIG. 9, the front-end fabrication steps for the photodetector circuit 900 following the selective heteroepitaxy of the CS materials (shown in FIG. 8) may be similar or identical to those steps utilized to form the photodetector circuit 700 in the embodiment of FIG. 7 (denoted by the same reference numerals). As shown, the dielectric material 910 (combined with dielectric material 810, if not removed) isolates the two CS material stacks formed by selective area heteroepitaxy.

Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

The embodiment of FIG. 9 may not require a separate trench isolation step (shown in FIG. 7) due to the isolation provided by the patterned dielectric 810. Some of the dielectric between the CS areas can be removed by etching or an alternative process, and then these regions can be filled with materials, such as metals, that would be opaque, to provide additional optical isolation. Without departing from the scope of the invention, such trench isolation could alternatively be formed in a backend step following bonding of the photodetector substrate, or chips from the substrate, to a target readout circuit Si CMOS substrate.

Figure 10:
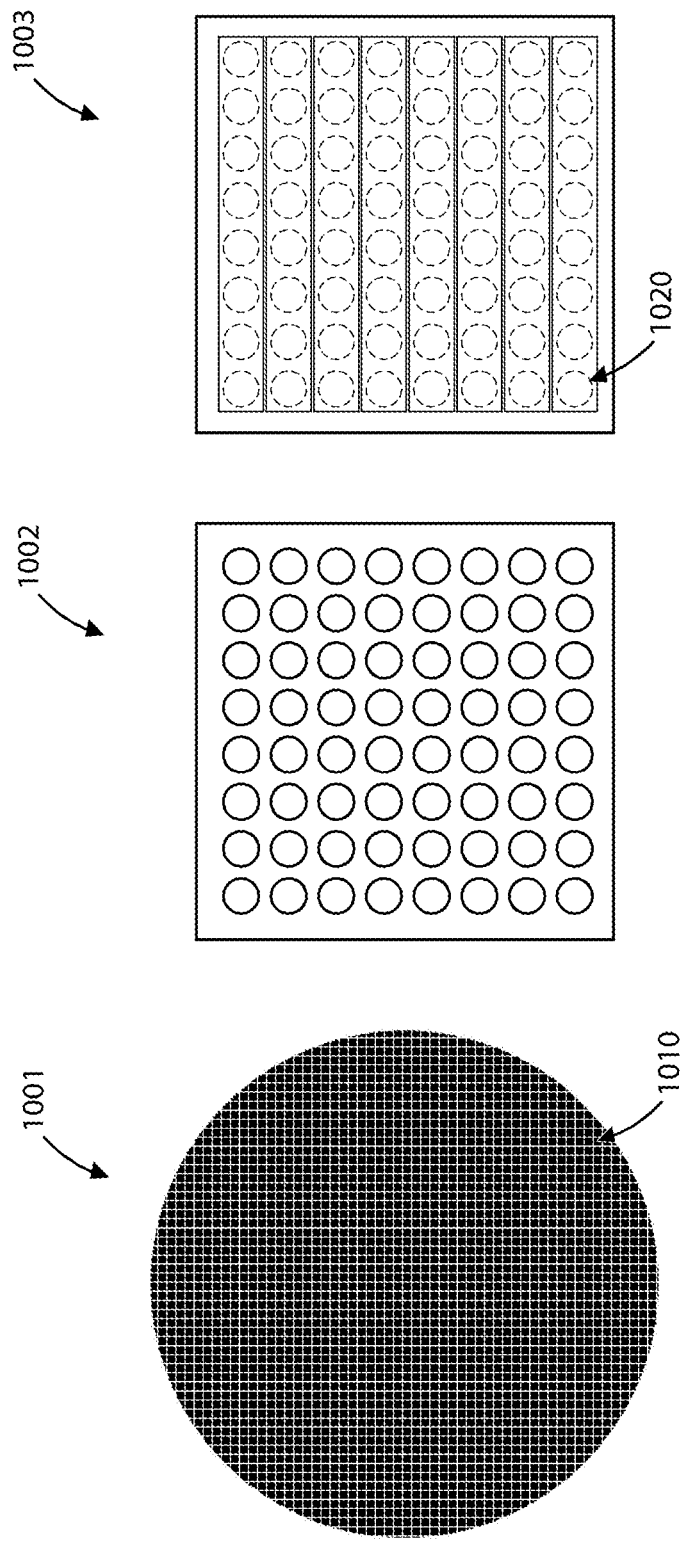
FIGS. 10A-10C are a top view description of a wafer with patterned die and top view descriptions of example dies patterned with circles or rectangular stripes for selective area heteroepitaxy, respectively, according to an example of the present invention.

FIGS. 10A-10C are simplified diagrams illustrating wafer die patterns according to various examples of the present invention. FIG. 10A illustrates a wafer 1001 with an example die pattern, where each individual die (e.g., die 1010) may vary in size/area from small, such as less than 1 mm×1 mm, to a larger size that is the maximum allowable for the lithography system used. Within each die, various patterns of the dielectric can be leveraged should selective area heteroepitaxy be utilized for CS material growth on Si. Examples can include circular patterns (shown in die 1002 of FIG. 10B), rectangular patterns (shown in die 1003 of FIG. 10C). Pattern shape and size selection can assist, along with growth optimization and pattern fill factor, to achieve higher material quality. For the rectangular stripe patterns shown in die 1003, circular photodetectors, denoted by the dashed circles (e.g., photodetector 1020), could be formed following growth by mesa etching or by diffusion, the latter of which would form a planar device. The patterns represent the area from which the dielectric, for selective area heteroepitaxy, is removed to expose the Si surface below the dielectric.

Other patterns, such as, but not limited to, squares, ovals, trapezoids, different size rectangles, parallelograms, and various polygons could be leveraged without departing from the scope of the invention.

The sequence of steps to complete the realization of such photodetectors and photodetector arrays, including those represented in the embodiments of FIG. 2-10C, can be carried out in a number of ways and in different order, and the design of the device layers and structure could be varied, without departing from the scope of the invention.

Figure 11:
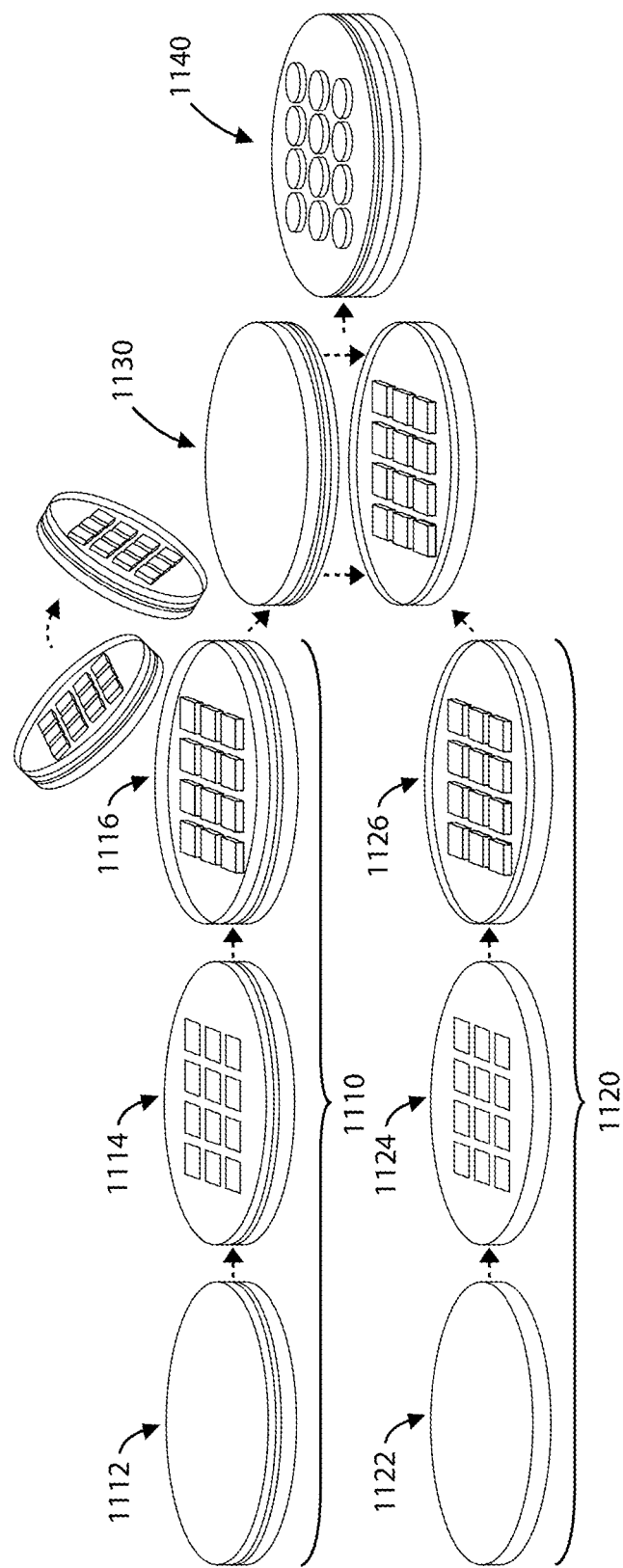
FIG. 11 is a simplified flow diagram illustrating a method to manufacture photodetectors and photodetector array circuits leveraging direct heteroepitaxy or selective area heteroepitaxy on a Si substrate, and the subsequent wafer-to-wafer bonding integration with a readout circuit wafer, followed by backside processing, according to an example of the present invention.

FIG. 11 is a simplified flow diagram illustrating a method to manufacture photodetectors and photodetector array circuits according to an example of the present invention. As shown, FIG. 11 illustrates and summarizes sequences of parallel steps that could be carried out to realize CS on Si photodetectors and photodetector arrays that are then integrated with CMOS circuits capable of functions including, but not limited to, read out, logic, AI, machine learning (ML), signal processing, and image processing. In an example, the present method includes a front-end photodetector fabrication process 1110 and a front-end CMOS IC fabrication process 1120 performed in parallel.

As shown, the front-end photodetector fabrication process 1110 can include providing a substrate 1112 (e.g., Si substrate, SOI substrate, or the like), performing CS on Si heteroepitaxy and forming device structures to produce device 1114, and performing metallization to produce device 1116. The CS on Si heteroepitaxy, device structure formation, and metallization steps can be carried out to realize structures such as, but not limited to, those described in the embodiments of FIG. 7 or FIG. 9. Other photodetector variants could also be fabricated and then follow a similar sequence of steps for integration with CMOS circuit wafers. For the front-end IC fabrication process 1120, the steps can similarly include providing a substrate 1122 (e.g., Si CMOS substrate, or the like), performing IC fabrication processes (e.g., ROIC on Si process and/or other IC front-end fabrication) to produce device 1124, and performing metallization to produce device 1126.

Following front-end fabrication of the photodetector circuits (process 1110) and the CMOS circuits (process 1120), the wafers (devices 1116 and 1126) could be bonded face-to-face (i.e., a flip-chip bonding configuration), as shown by device 1130, leveraging common bonding techniques such as, but not limited to, oxide-to-oxide and copper-to-copper (Cu-to-Cu) bonding. The precise steps for back-end fabrication, including bonding integration, could vary depending on the photodetector structure and photodetector front-end fabrication sequence, and the CMOS device structure and CMOS front-end fabrication sequence, without departing from the scope of the invention.

Following the bonding, back-end fabrications steps may be performed to produce a processed device 1140 (e.g., device 200 of FIG. 2). Such back-end fabrication steps may include, but are not limited to: removal of the photodetector handle wafer, either partially or entirely by grinding, etching, or polishing, or a combination therein; application of backside contacts, which could be made to either the n-side or p-side of the photodetector, depending on the orientation of the photodetector structure (i.e., whether the photodetector is a PIN or PN structure from the top down, or NIP or NP structure from the top down; application of color filters; application of lenses or other optics). The device structure could be FSI or BSI and the precise steps and the order of the steps could vary without departing from the scope of the invention.

Alternatively to the wafer-to-wafer process described, the fabrication of photodetectors bonded to CMOS circuits could also be carried out in a chip-to-wafer or chip-to-chip fashion. Those of ordinary skill in the art will recognize other variations, modifications, and alternatives.

Figure 12:
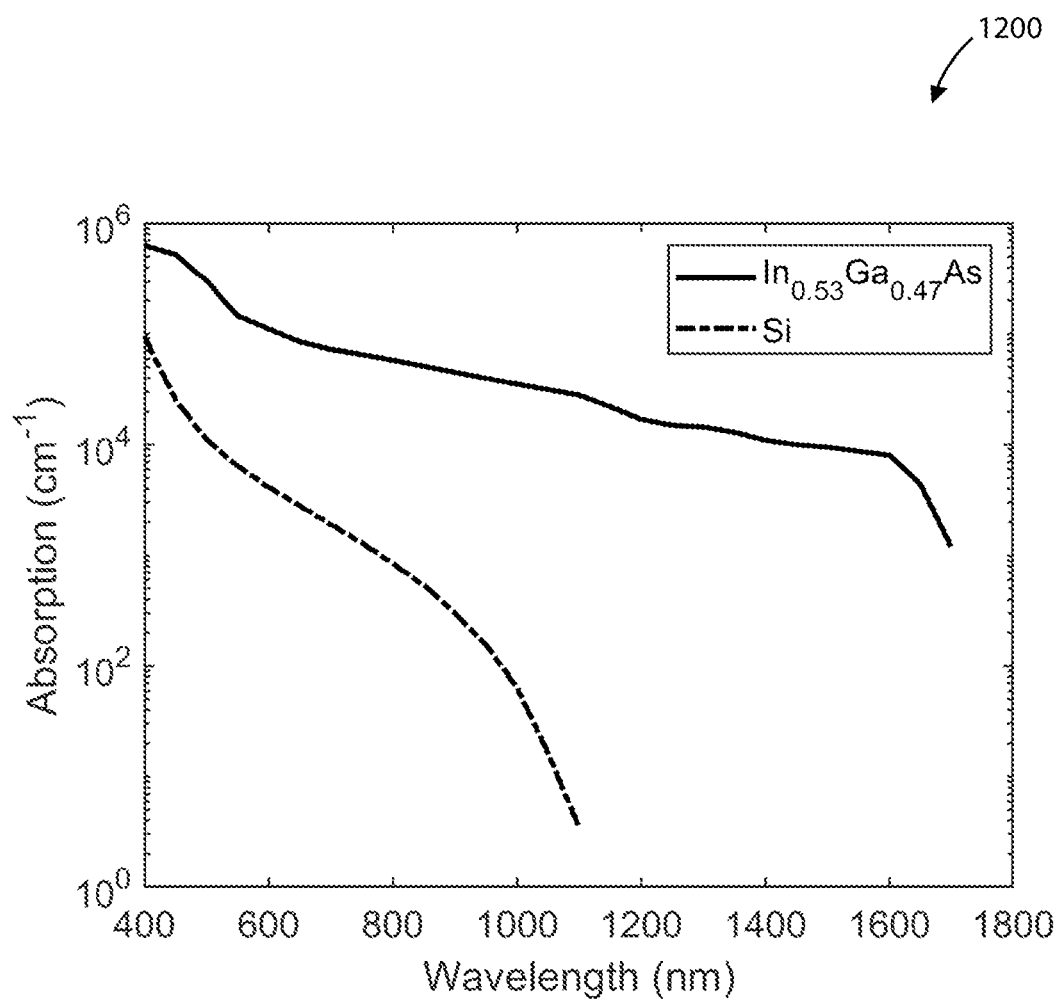
FIG. 12 is a simplified diagram illustrating a plot of the approximate absorption spectra for InGaAs material, which is used in the present invention, and Si material, which is used in conventional CMOS sensing devices.

FIG. 12 is a simplified diagram illustrating a plot 1200 of the approximate absorption spectra for InGaAs material, which is used in the present invention, and Si material, which is used in conventional CMOS sensing devices. To prove the method and device, we plotted a compilation of data for the absorption of InGaAs (solid line) and Si (dotted line) over a wide wavelength range to illustrate the benefit and advantages of the present techniques. As illustrated, the absorption of InGaAs is higher over the wavelength range considered, and the wavelength range of InGaAs extends to longer wavelength than that for Si. The spectrum illustrated for InGaAs is for an indium composition of 0.53 and a gallium composition of 0.47. This composition is commonly used as it is lattice matched to InP. The absorption wavelength range for InGaAs can be extended further to longer wavelength by altering the InGaAs composition, which incorporates strain.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A vehicle apparatus, the device comprising:
a vehicle comprising a drive mechanism, the drive mechanism being configured to cause the vehicle to move from a first location to a second location; and
a module device comprising
a housing, having an exterior region and an interior region, the exterior region having a display portion and a sensing portion and a detecting portion;
a laser device configured to emit electromagnetic radiation having 850 to 1550 nm wavelength range and spatially disposed to include an aperture configured on the sensing portion; and
a circuit for a photodetector comprising:
a first terminal;
a second terminal;
a silicon (Si) substrate comprising a surface region;
a buffer material comprising a compound semiconductor (CS) material deposited on the surface region of the Si substrate using direct heteroepitaxy such that the CS material is characterized by a first bandgap characteristic, a first thermal characteristic, a first polarity, and a first crystalline characteristic, and the silicon substrate is characterized by a second bandgap characteristic, a second thermal characteristic, a second polarity, and a second crystalline characteristic;
an array of photodetectors, the array being characterized by N and M pixel elements, where N is an integer greater than 7, and M is an integer greater than 0; each of the pixel elements having a characteristic length ranging from 0.3 micrometers to 30 micrometers, each of the photodetectors comprising:
an n-type material comprising an InP material comprising a silicon impurity having a concentration ranging from 3E17 cm-3 to 5E18 cm-3;

an absorption material overlying the n-type material, the absorption material comprising a InGaAs containing material, the absorption material being primarily free from any impurity;

a p-type material overlying the absorption material, the p-type material comprising a zinc impurity or a beryllium impurity having a concentration ranging from 3E17 cm-3 to 5E18 cm-3;

a first electrode coupled to the n-type material and coupled to the first terminal;

a second electrode coupled to the p-type material and coupled to the second terminal to define a two terminal device;

an illumination region characterized by an aperture region to allow a plurality of photons to interact with the CS material and be absorbed by a portion of the absorption material to cause a generation of mobile charge carriers that produce an electric current between the first terminal and the second terminal;

a responsivity (Amperes/Watt) greater than 0.1 Amperes/Watt characterizing the circuit; and a photodiode quantum efficiency greater than 10% characterizing the circuit.

2. The apparatus of claim 1 wherein the wavelength range is 940 nm.

3. The apparatus of claim 1 wherein the module device is configured on an exterior region of the vehicle, the exterior region being a roof portion of the vehicle.

4. The apparatus of claim 1 wherein the vehicle is selected from a boat, a drone, an airplane, a truck, an automobile, an autonomous vehicle, or a hybrid vehicle.

5. The apparatus of claim 1 wherein the module device comprises a classifier module coupled within an interior region of the housing, the classifier module including a classification of one or more classes including a speed sensing, image sensing, facial recognition, distance sensing, acoustics sensing, thermal sensing, color sensing, a biological sensor, a gravitational sensing, or a mechanical motion sensing.

6. The apparatus of claim 1 wherein the Si substrate is configured to allow the photons to traverse there through.

7. The apparatus of claim 1 wherein the illumination region is free from any portion of the silicon substrate.

8. The apparatus of claim 1 wherein the laser device comprises a VCSEL array device or a laser device coupled to a mirror device.

9. The apparatus of claim 1 wherein the circuit comprises a color filter overlying the illumination region and a lens overlying the color filter.

10. The apparatus of claim 1 wherein the CS material comprises InP, InGaAs, GaAs, GaP, InGaAsP, InAlGaAs, InGaP, or a combination thereof.

11. The apparatus of claim 1 wherein each photodetector is configured with a separate absorption material comprising InGaAs or InGaAsP, and a multiplication material comprising InP whereby the multiplication material generates additional charge carriers by avalanche gain.

12. The apparatus of claim 1 wherein the absorption material comprises InAs quantum dot or quantum dash containing material.

13. The apparatus of claim 1 wherein each of the photodetectors comprises:

an n-type material comprising a GaAs material comprising a silicon impurity having a concentration ranging from 3E17 cm-3 to 5E18 cm-3;

an absorption material overlying the n-type material, the absorption material comprising InAs quantum dot material;

a p-type material overlying the absorption material, the p-type material comprising a zinc impurity or a beryllium impurity or a carbon impurity having a concentration ranging from 3E17 cm-3 to 1E20 cm-3.

14. The apparatus of claim 1 wherein the circuit is characterized as a back side illuminated (BSI) device.

15. The apparatus of claim 1 wherein the circuit is characterized as a front side illuminated (FSI) device.

16. The apparatus of claim 1 wherein the module device comprises:

a readout integrated circuit comprising:

a first input terminal coupled to the first terminal;

a second input terminal coupled to the second terminal; and a pixel output.

17. The apparatus of claim 16 wherein module device comprises an analog front end circuit coupled to the first input terminal and the second input terminal.

18. The apparatus of claim 17 wherein the module device comprises analog to digital conversion.

* * * * *